United States Patent
Lim

(10) Patent No.: US 7,361,527 B2
(45) Date of Patent: Apr. 22, 2008

(54) IMAGE SENSOR WITH IMPROVED CHARGE TRANSFER EFFICIENCY AND METHOD FOR FABRICATING THE SAME

(75) Inventor: Youn-Sub Lim, Chungcheongbuk-do (KR)

(73) Assignee: Magnachip Semiconductor, Ltd., Chungcheongbuk-Do (KR)

( * ) Notice: Subject to any disclaimer, the term of this patent is extended or adjusted under 35 U.S.C. 154(b) by 150 days.

(21) Appl. No.: 11/193,253

(22) Filed: Jul. 28, 2005

(65) Prior Publication Data
US 2006/0022232 A1 Feb. 2, 2006

(30) Foreign Application Priority Data
Jul. 29, 2004 (KR) .................. 10-2004-0059472

(51) Int. Cl.
*H01L 21/00* (2006.01)
(52) U.S. Cl. .......................... 438/60; 438/75
(58) Field of Classification Search ............... 438/57, 438/60, 73, 74, 75, 78, 79; 257/290, 291, 257/292, 222, 223
See application file for complete search history.

(56) References Cited

U.S. PATENT DOCUMENTS 6,441,411 B2 * 8/2002 Nozaki et al. ............... 257/292
2002/0167031 A1 * 11/2002 Francois ...................... 257/293
2004/0173866 A1 * 9/2004 Egawa et al. ................ 257/462
2006/0118835 A1 * 6/2006 Ellis-Monaghan et al. ... 257/292
2006/0255382 A1 * 11/2006 Rhodes ........................ 257/292

\* cited by examiner

*Primary Examiner*—S. V. Clark
(74) *Attorney, Agent, or Firm*—Blakely, Sokoloff, Taylor & Zafman LLP

(57) ABSTRACT

An image sensor includes: a gate structure on a semiconductor layer of a first conductive type; a first impurity region of the first conductive type aligned with one side of the gate structure and extending to a predetermined depth from a surface portion of the semiconductor layer; spacers formed on sidewalls of the gate structure; and a second impurity region of a second conductive type formed in a portion of the semiconductor layer under the first impurity region, wherein the first impurity region includes: a first region of which portion aligned with the one side of the gate structure; a second region aligned with the one of the spacers and having a concentration higher than that of the first region; and a third region apart from the one side of the gate structure with a predetermined distance and having a concentration higher than that of the second region.

5 Claims, 10 Drawing Sheets

Top View of Pixel 2 dim Potential (Vmax)

2 dim Potential of PD-Tx-FD Center(XZ plane)

IMAGE SENSOR WITH IMPROVED CHARGE TRANSFER EFFICIENCY AND METHOD FOR FABRICATING THE SAME

FIELD OF THE INVENTION

The present invention relates to an image sensor and a method for fabricating the same; and, more particularly, to an image sensor with improved charge transfer efficiency and a method for fabricating the same.

DESCRIPTION OF RELATED ARTS

Image sensors are semiconductor devices that convert an optical image into an electrical signal. Examples of such image sensors are charge coupled devices (CCDs) and complementary metal-oxide-semiconductor (CMOS) image sensors.

CCDs are devices where charge carriers transferred from metal-oxide-semiconductor (MOS) capacitors are stored into the MOS capacitors closely allocated around the CCDs. On the other hand, CMOS image sensors take a switching mode that sequentially detects outputs by using MOS transistors fabricated in the same number of pixels via CMOS technology using a control circuit and a signal processing circuit as a peripheral circuit. Particularly, CMOS image sensors have been widely used in portable photographing devices due to advantages of CMOS image sensors such as the large-scale of integration and low driving voltage.

Meanwhile, one important characteristic of CMOS image sensors is a dead zone characteristic, which is closely related to a quality of an image in low brightness. Also, as CMOS technology has been developed, sizes of pixels have proportionally decreased, and thus, sizes of photodiodes, which are photo-response regions, are also reduced. The decreased driving voltage may become one cause of degraded quality of an image in low brightness. Therefore, a photodiode of an image sensor needs to have a structure that can improve charge transfer efficiency. Especially, it is generally essential to obtain a photodiode structure optimized for conditions of low power voltage and low field.

FIG. 1 is a cross-sectional view showing a part of a unit pixel of a conventional image sensor.

As shown in FIG. 1, a plurality of device isolation regions 12 are formed locally in a bottom structure including a highly doped $p^{++}$-type substrate 10 and a p-epi layer 11. Hereinafter, the bottom structure is referred to as a semiconductor layer. A gate structure, more specifically, a transfer gate Tx in a CMOS image sensor with a pixel structure of 4 transistors, is formed on the semiconductor layer. The gate structure includes a conductive layer 14 and an insulation layer 13, and spacers 16 are formed on sidewalls of the gate structure. By performing an ion implantation process, a photodiode PD is formed in a predetermined portion of the semiconductor layer aligned with one side of the gate structure, i.e., the transfer gate Tx. The photodiode PD includes a p-type impurity region 17 (hereinafter referred to as a p0 region) and an n-type impurity region 15 (hereinafter referred to as an $n^-$ region). A floating diffusion (FD) region 18 is formed in a predetermined portion of the semiconductor layer aligned with the other side of the transfer gate Tx by implanting highly doped $n^+$-type impurities. The conductive layer 14 is formed in a single layer of polysilicon or tungsten silicide or in a stack structure thereof. The spacers 16 are formed by using nitride, oxide or oxynitride.

The unit pixel having the above described structure as shown in FIG. 1 should be capable of transferring electrons generated from the photodiode PD to the floating diffusion region FD. Therefore, the $n^-$ region 15 of the photodiode PD is made to contact the transfer gate Tx, so that a fringing field applied on the $n^-$ region 15 of the photodiode PD increases when charges are transferred by applying a power voltage to the transfer gate Tx. The increasing fringing field results in an easier attraction and transfer of charges from the $n^-$ region 15.

As shown in FIG. 1, the $n^-$ region 15 is aligned with one side of the transfer gate Tx, and in this case, a potential barrier is generated between the $n^-$ region 15 and a channel of the transfer gate Tx because of diffusion in the p0 region 17. This potential barrier impedes the charge transfer, thereby decreasing the charge transfer efficiency. Also, the potential barrier causes a generation of electrons that are not transferred to the floating diffusion region 18 and as a result, characteristics of an image sensor may become degraded.

In an attempt to overcome this disadvantage, a profile of the p0-type impurity region is changed to change a potential distribution of the photodiode.

FIG. 2A is a cross-sectional view showing a part of a unit pixel of another conventional image sensor. It should be noted that the same reference numerals are used for the same configuration elements described in FIG. 1 and thus, detailed description of such elements will be omitted.

In FIG. 2A, the p0 region shown in FIG. 1 is divided into a first p01 region 15 and a second p02 region 18. The first p01 region 15 is formed to be aligned with one side of a transfer gate Tx by performing an ion implantation process prior to forming spacers 17. The second p02 region 18 is formed such that a profile of the selected spacer 17 is transcribed at a bottom portion of a semiconductor layer by performing an ion implantation process after forming the spacers 17. Therefore, because of this specific alignment of the first p01 region 15 and the second p02 region 18, the p0 region has an indentation where the p0 region is aligned with the selected spacer 17.

FIG. 2B is a diagram briefly showing a potential distribution caused by the indented p0 region shown in FIG. 2A.

As shown, the potential has a stepped distribution and thus, electrons can be transferred more easily compared with the previous conventional image sensor.

FIG. 3 is a graph showing a two-dimensional top view of a potential distribution and a concentration distribution of a conventional image sensor.

As shown in FIG. 3, the potential distribution between an edge region and a central region of a photodiode PD is discontinuous as indicated by reference denotations 'C' and 'E'.

FIG. 4 is a graph showing a two-dimensional cross-sectional view of a potential distribution and a concentration distribution of a conventional image sensor.

In FIG. 4, the potential distribution between an edge region and a central region of a photodiode PD is discontinuous as shown by a reference denotation 'G'.

However, even in the latter described conventional image sensor, the charge transfer efficiency may still be limited due to a current trend in low voltage and micronization of image sensors.

SUMMARY OF THE INVENTION

It is, therefore, an object of the present invention to provide an image sensor with improved charge transfer efficiency and a method for fabricating the same.

In accordance with an aspect of the present invention, there is provided an image sensor, including: a gate structure on a semiconductor layer of a first conductive type; a first impurity region of the first conductive type aligned with one side of the gate structure and extending to a predetermined depth from a surface portion of the semiconductor layer; spacers formed on sidewalls of the gate structure; and a second impurity region of a second conductive type formed in a portion of the semiconductor layer under the first impurity region, wherein the first impurity region includes: a first region of which portion is disposed under one of the spacers and aligned with the one side of the gate structure; a second region aligned with the one of the spacers and having a concentration higher than that of the first region; and a third region apart from the one side of the gate structure with a predetermined distance and having a concentration higher than that of the second region.

In accordance with another aspect of the present invention, there is provided a method for fabricating an image sensor, including: forming a gate structure on a semiconductor layer of a first conductive type; performing a first ion implantation process to form a first impurity region of a second conductive type aligned with one side of the gate structure and extending to a predetermined depth from a surface portion of the semiconductor layer; performing a first blanket ion implantation process to form a second impurity region of the first conductive type aligned with the one side of the gate structure and extending to a predetermined depth from the surface portion of the semiconductor layer; forming spacers on sidewalls of the gate structure; performing a second blanket ion implantation process to form a third impurity region of the first conductive type aligned with one of the spacers and extending to a predetermined depth from the surface portion of the semiconductor layer; forming an ion implantation mask exposing the surface portion of the semiconductor layer apart from the one side of the gate structure with a predetermined distance which is larger than a thickness of the one of the spacers; and performing a second ion implantation process using the ion implantation mask, thereby obtaining a fourth impurity region of the first conductive type extending to a predetermined depth from the surface portion of the semiconductor layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

An image sensor with improved charge transfer efficiency and a method for fabricating the same in accordance with embodiments of the present invention will be described in detail with reference to the accompanying drawings.

Figure 5:
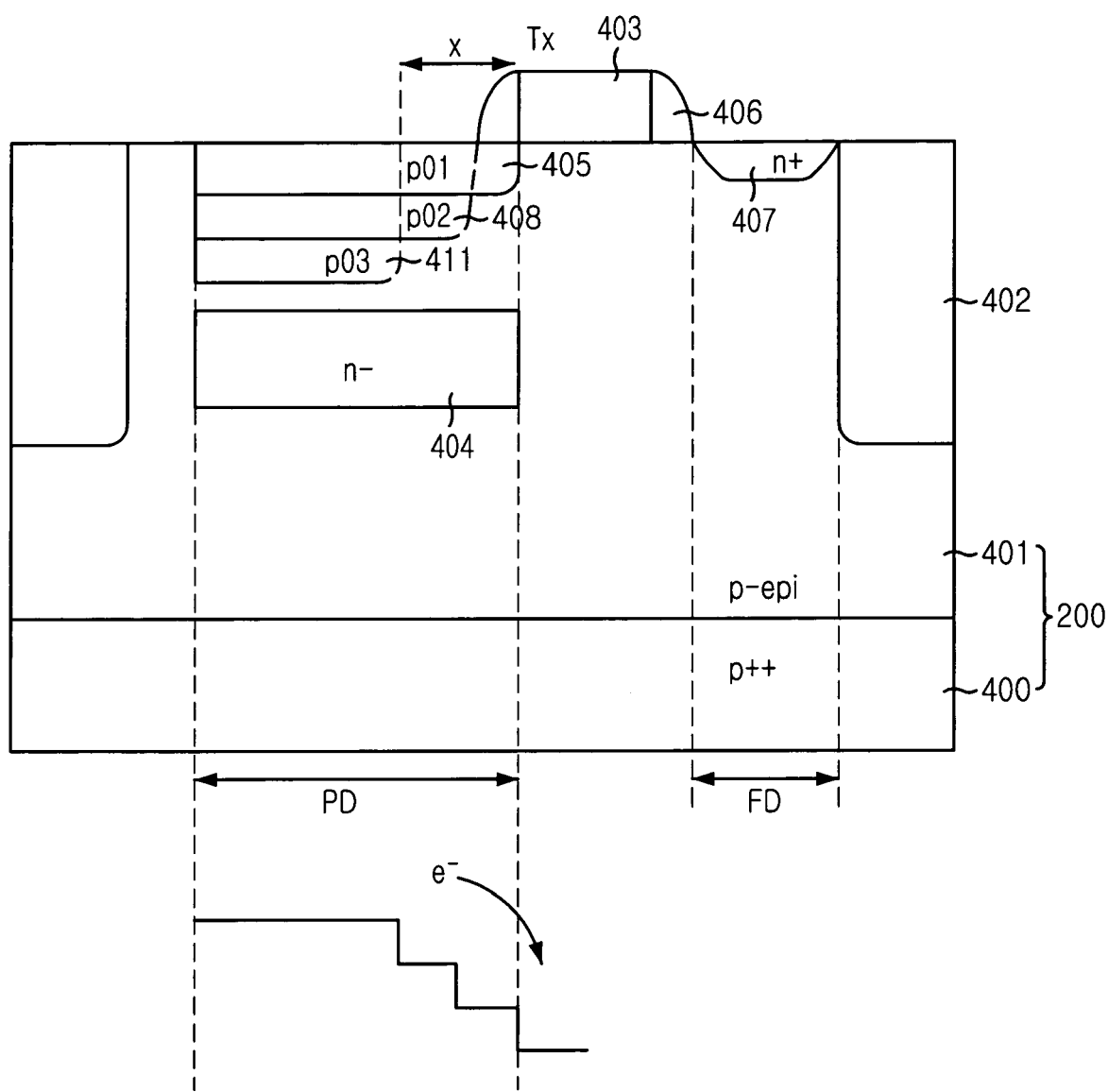
FIG. 5 is a cross-sectional view showing a part of a unit pixel of an image sensor in accordance with an embodiment of the present invention.

FIG. 5 is a cross-sectional view showing a part of a unit pixel of an image sensor in accordance with an embodiment of the present invention.

As shown, the image sensor includes: a gate structure, more specifically, a transfer gate Tx, formed on a p-type semiconductor layer 200; a first p-type impurity (p01) region 405; a pair of spacers 406 formed on sidewalls of the transfer gate Tx; a second p-type impurity (p02) region 408; a third p-type impurity (p03) region 411; and an n$^-$-type impurity region 404 for use in a photodiode.

The p-type semiconductor layer 200 includes a highly doped p$^{++}$-type substrate 400 and a p-epi layer 401. The gate structure (i.e., the transfer gate Tx) includes a conductive layer 403.

The first p-type impurity (p01) region 405 extends to a first depth from a surface of the semiconductor layer 200 and is aligned with one side of the transfer gate Tx. The second p-type impurity (p02) region 408 extends to a second depth that is greater than the first depth from the surface of the semiconductor layer 200 and is aligned with one of the spacers 406. The third p-type impurity (p03) region 411 extends to a third depth that is greater than the second depth from the surface of the semiconductor layer 200 and is aligned at a region apart from the one side of the transfer gate Tx with a predetermined distance 'x' larger than a thickness of the individual spacer 406. By performing an ion implantation process, the n$^-$-type impurity region 404 is formed inside a portion of the semiconductor layer 200 beneath the third p-type impurity (p03) region 411. The first p-type impurity (p01) region 405, the second p-type impurity (p02) region 408, the third p-type impurity (p03) region 411, and the n$^-$-type impurity region 404 construct a photodiode PD in the form of a pn junction. Although the first p-type impurity (p01) region 405, the second p-type impurity (p02) region 408, the third p-type impurity (p03) regions 411, and the n$^-$-type impurity region 404 are considered to have different depths, the actual depths of the first p-type impurity (p01) region 405, the second p-type impurity (p02) region 408, the third p-type impurity (p03) regions 411, and the n$^-$-type impurity region 404 are nearly the same. Since the third p-type impurity (p03) region 411, the second p-type impurity (p02) region 408 and the first p-type impurity (p01) region 405 are formed through three applications, two applications and one application of the ion implantation process, respectively, a concentration of the p-type impurity exhibits a decreasing gradient as going from the third p-type impurity (p03) region 411 to the first p-type impurity (p01) region 405, i.e., in the direction towards the transfer gate Tx.

Also, the image sensor further includes: a highly doped n$^+$-type floating diffusion (FD) region 407; and a plurality of device isolation regions 402. The highly doped n$^+$-type floating diffusion region 407, which senses photo-generated charges generated at the photodiode PD and then transferred as the transfer gate Tx is turned on, faces to the photodiode PD by having the transfer gate Tx in between the photodiode PD and the highly doped n$^+$-type floating diffusion (FD) region 407. Also, the highly doped n$^+$-type floating diffusion (FD) region 407 extends to a certain depth from the surface of the semiconductor layer 200 and is aligned with one of the spacers 406 at the other side of the transfer gate Tx. The device isolation regions 402 are formed in edge sides of the photodiode PD and the highly doped n$^+$-type floating diffusion (FD) region 407.

Meanwhile, by adjusting the predetermined distance 'x' from the transfer gate Tx during forming the third p-type impurity (p03) region 411 via ion-implantation process using an ion implantation mask, an overall concentration gradient of the photodiode PD can be adjusted as well. At the bottom side of FIG. 5, a potential distribution of the third to the first p-type impurity regions 411, 408 and 405 of the photodiode PD is shown. Since the first p-type impurity (p01) region 405, the second p-type impurity (p02) region 408 and the third p-type impurity (p03) region 411 are aligned underneath the portion of the semiconductor layer 200 with different spacing distances from the one side of the transfer gate Tx, the potential from the third p-type impurity (p03) region 411 to the first p-type impurity (p01) region 405 decreases steeply in the form of steps. As a result, the photo-generated charges at the photodiode PD are transferred actively in the direction of an arrow, thereby increasing the charge transfer efficiency.

Hereinafter, a method for fabricating the above described image sensor is described in detail.

Figure 6A:
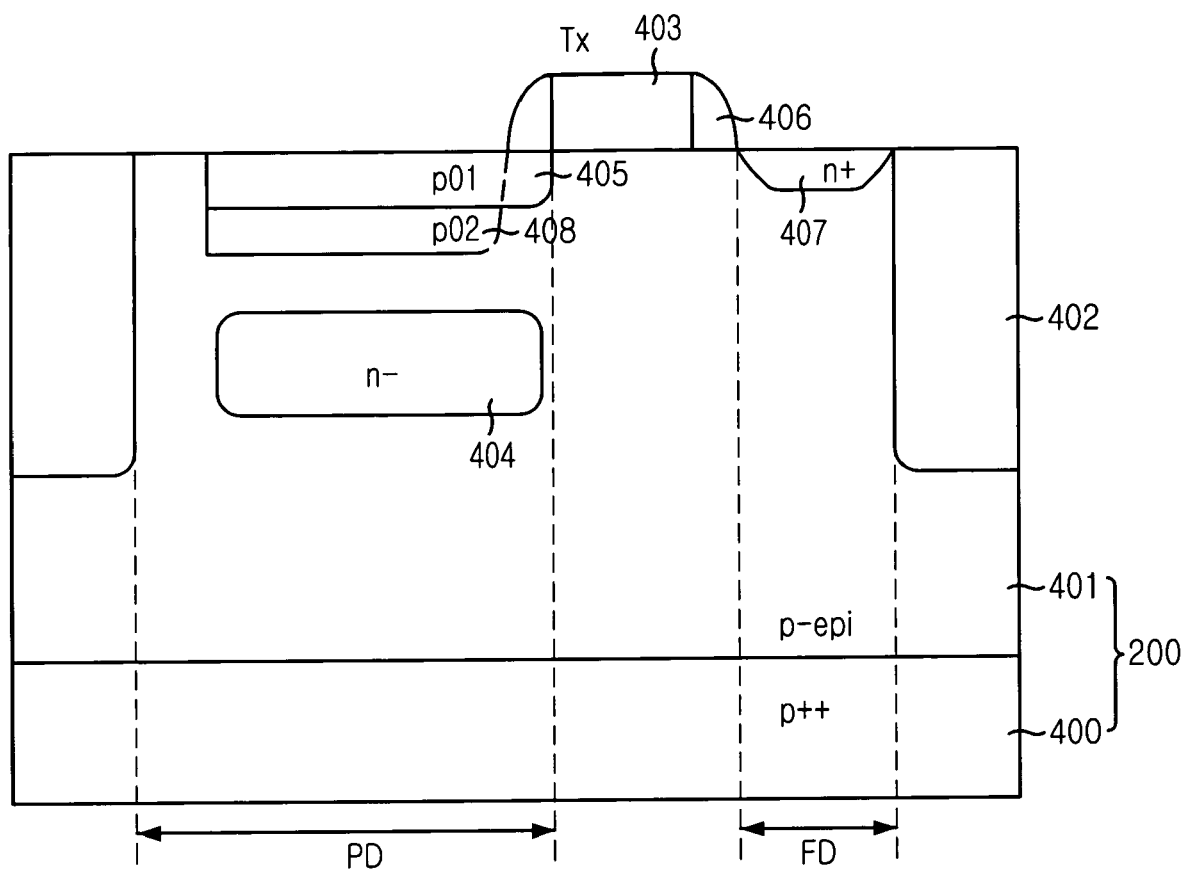
FIGS. 6A to 6C are cross-sectional views of an image sensor fabricated according to an embodiment of the present invention for illustrating a method for fabricating the same.
Figure 6B:
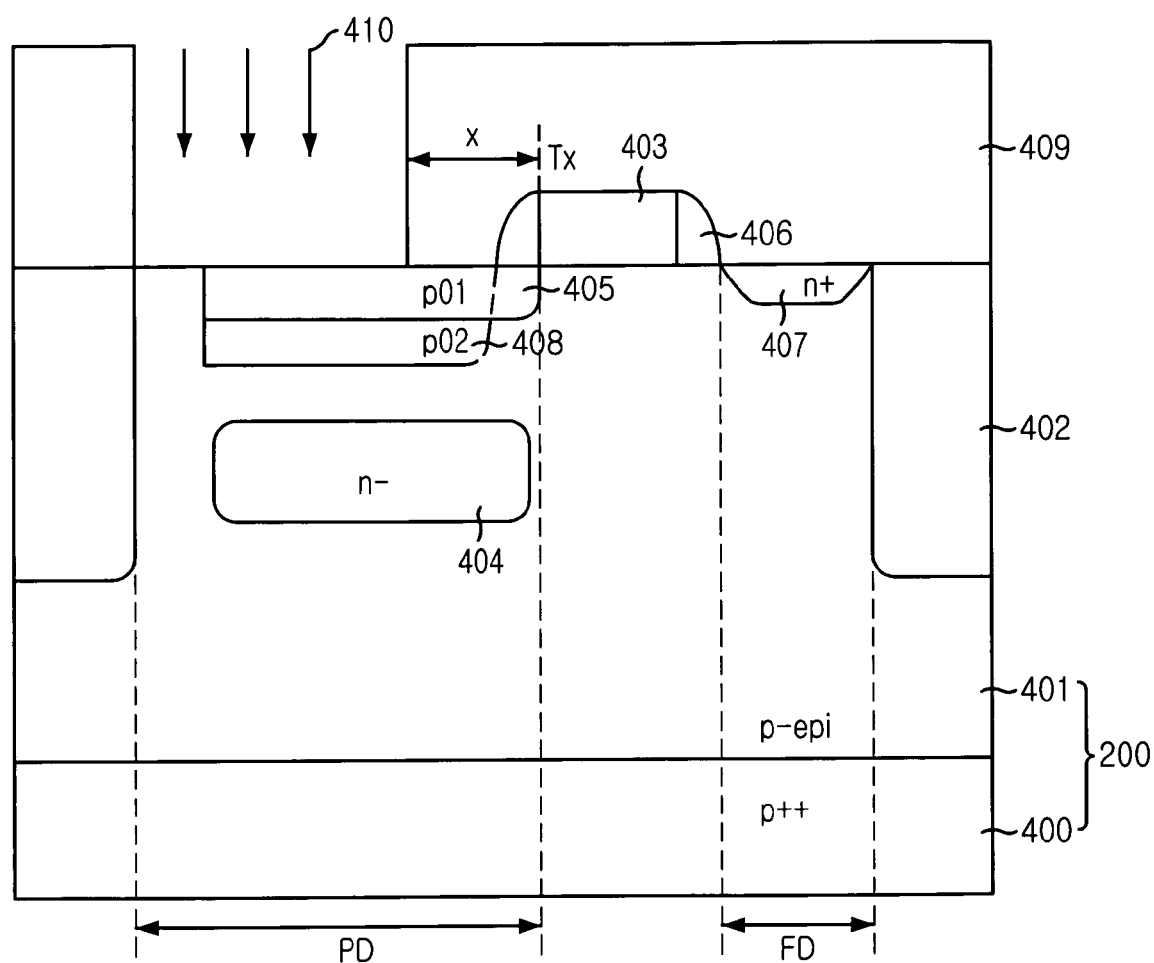
Figure 6C:
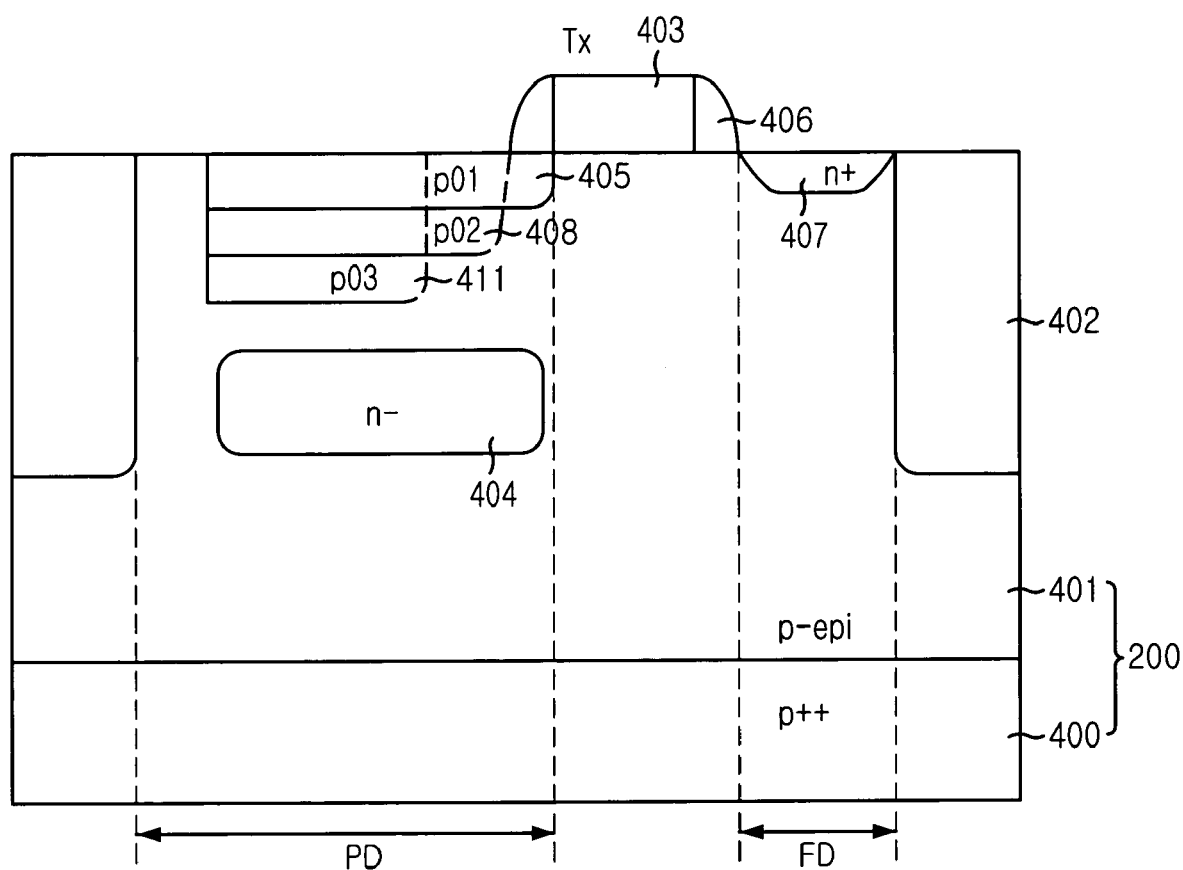

FIGS. 6A to 6C are cross-sectional views illustrating a method for fabricating an image sensor in accordance with one embodiment of the present invention. Herein, it should be noted that the same reference numerals are used for the same configuration elements described in FIG. 5.

Referring to FIG. 6A, by performing a shallow trench isolation (STI) method or a local oxidation of silicon (LOCOS) method, a plurality of device isolation regions 402 are formed in a p-type semiconductor layer 200 including a highly doped p$^{++}$-type substrate 400 and a p-epi layer 401. Then, an insulation layer (not shown) and a conductive layer 403 are deposited on the semiconductor layer 200 and patterned to form a gate structure, more specifically, a transfer gate Tx. The conductive layer 403 includes a material selected alone or in combination from a group consisting of polysilicon, tungsten and tungsten silicide.

Although not illustrated, a first ion implantation mask is formed and, an ion implantation process is performed in alignment with one side of the transfer gate Tx. From the ion implantation process, an n$^-$-type impurity region 404 for use in a photodiode is formed. Then, the first ion implantation mask is removed.

Although a screening layer for protecting a surface of the semiconductor layer 200 against the ion implantation process is used, the screening layer is not illustrated in FIG. 6A for the sake of simplification. The ion implantation process uses a typically implemented concentration of an impurity, and an energy level of the ion implantation process is adjusted to obtain a deep doping profile for the n$^-$-type impurity region 404.

Next, a first blanket ion implantation process is performed in alignment with the one side of the transfer gate Tx, thereby obtaining a first p-type impurity (p01) region 405 extending from a surface portion of the semiconductor layer 200. Although not illustrated, an insulation layer is formed over the gate structure, i.e., the transfer gate Tx, and then, subjected to an etch-back process to form spacers 406 on sidewalls of the transfer gate Tx. The insulation layer is an oxide-based or nitride-based layer.

Afterwards, another ion implantation process is performed in alignment with the spacers 406 to form n-type and p-type source/drain regions. A floating diffusion (FD) region 407 aligned with one of the spacers 406 at the other side of the transfer gate Tx is formed by implanting n$^+$-type impurities.

A second blanket ion implantation process is performed to form a second p-type impurity (p02) region 408 in alignment with one of the spacers 406 at the one side of the transfer gate Tx. The second p-type impurity (p02) region 408 is apart from the transfer gate Tx with a predetermined distance that is same as a thickness of the individual spacer 406. The second p-type impurity (p02) region 408 can be formed to be deeper than or same as the first p-type impurity (p01) region 405. Since those regions except for the region where the spacers 406 are formed are subjected to the blanket ion implantation process twice, a concentration of the p-type impurities at these regions are higher than at the region where the spacers 406 are formed. The first p-type impurity (p01) region 405 and the second p-type impurity (p02) region 408 have a concentration gradient that is shaped same as the one of the spacers 406.

Referring to FIG. 6B, a second ion implantation mask 409 is formed such that the second ion implantation mask 409 covers a portion of the photodiode region disposed with a predetermined distance 'x', which is a distance apart from the one side of the transfer gate Tx. The predetermine distance 'x' is larger than the thickness of the spacers 406. Then, an ion implantation process denoted with a reference numeral 410 is performed, thereby obtaining a third p-type impurity (p03) region 411 as shown in FIG. 6C. It should be noted that the above ion implantation process 410 for forming the third p-type impurity (p03) region 411 utilizes a higher energy level than the second blanket ion implantation process for forming the second p-type impurity (p02) region 408. The energy level of the second blanket ion implantation process is higher than that of the first blanket ion implantation process for forming the first p-type impurity (p01) region 405. Also, the second and the third p-type impurity (p01 and P02) regions 408 and 411 can be formed by using a higher level of energy than the first p-type impurity (p01) region 405.

The third p-type impurity (p03) region 411 can be formed to be deeper than or same as the second p-type impurity (p02) region 408. The third p-type impurity (p03) region 411 is formed through performing the ion implantation process three times, and the second p-type impurity (p02) region 408, which is apart from the one side of the transfer gate Tx with a distance obtained by subtracting the thickness of the individual spacer 406 from the predetermined distance 'x', is formed through performing the ion implantation process twice. The first p-type impurity (p01) region 405 underneath the one of the spacers 406 is formed through performing the ion implantation process once. Hence, the first p-type impurity (p01) region 405, the second p-type impurity (p02) region 408 and the third p-type impurity (p03) region 411 exhibit a concentration gradient with a triple indentation structure in which the profiles of the corresponding spacer 406 and the ion implantation mask 409 are transcribed to certain portions of the semiconductor layer 200. By adjusting a spacing distance from the transfer gate Tx during forming the second ion implantation mask 409, the profile of the third p-type impurity (p03) region 411 can be changed as well.

Figure 7:
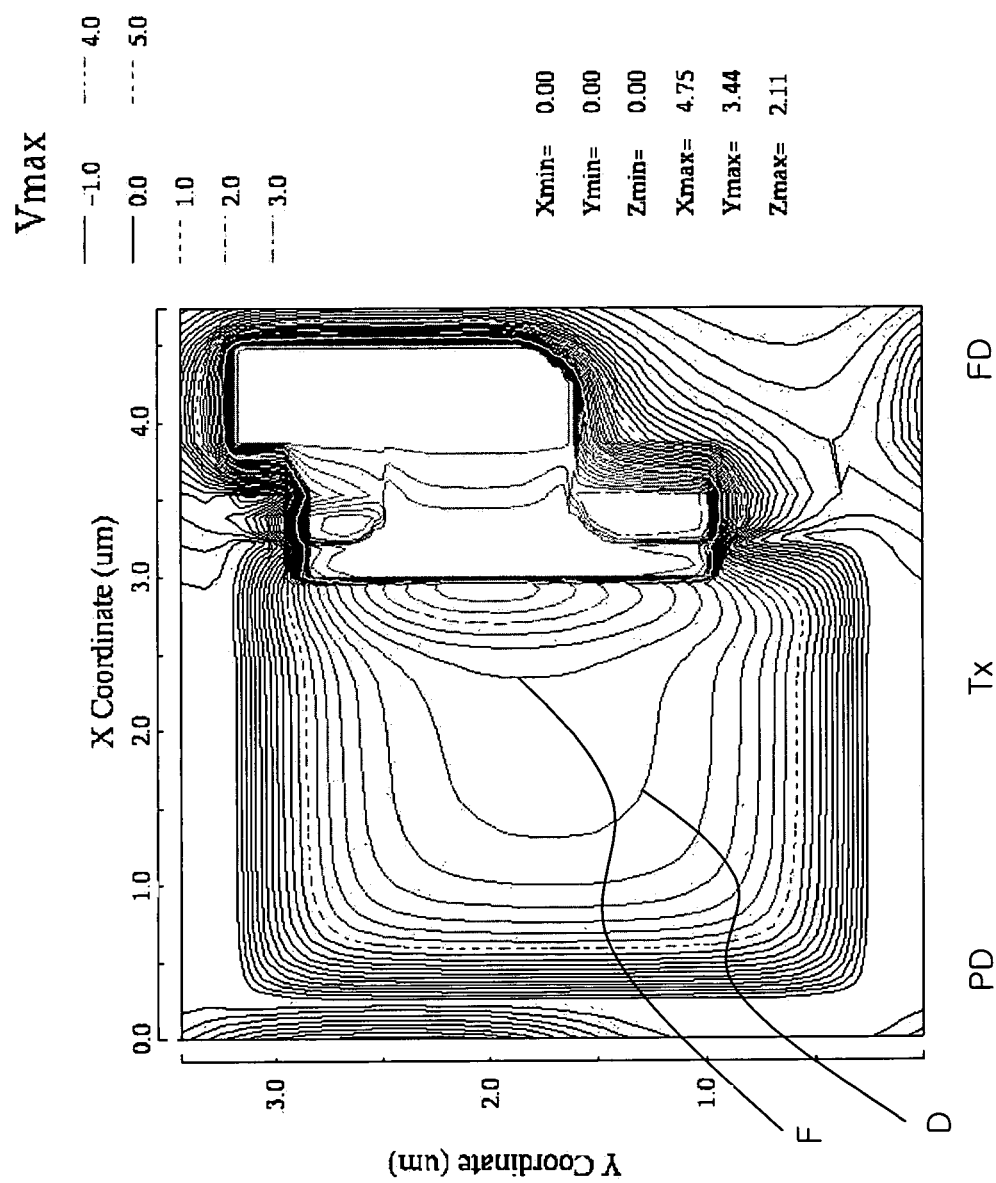
FIG. 7 is a graph showing a two-dimensional top view of a potential distribution and a concentration distribution of an image sensor in accordance with a specific embodiment of the present invention.

FIG. 7 is a graph showing a two-dimensional top view of a potential distribution and a concentration distribution of an image sensor in accordance with a specific embodiment of the present invention.

Figure 1:
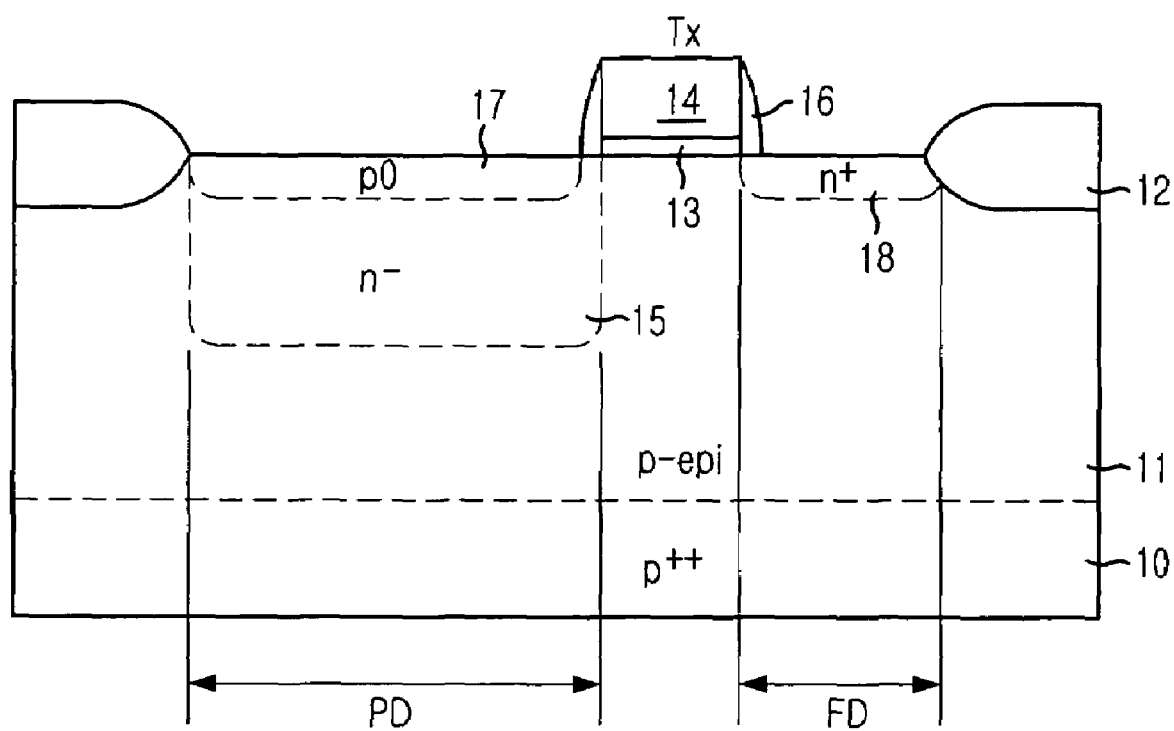
FIG. 1 is a cross-sectional view showing a part of a unit pixel of a conventional image sensor.
Figure 2A:
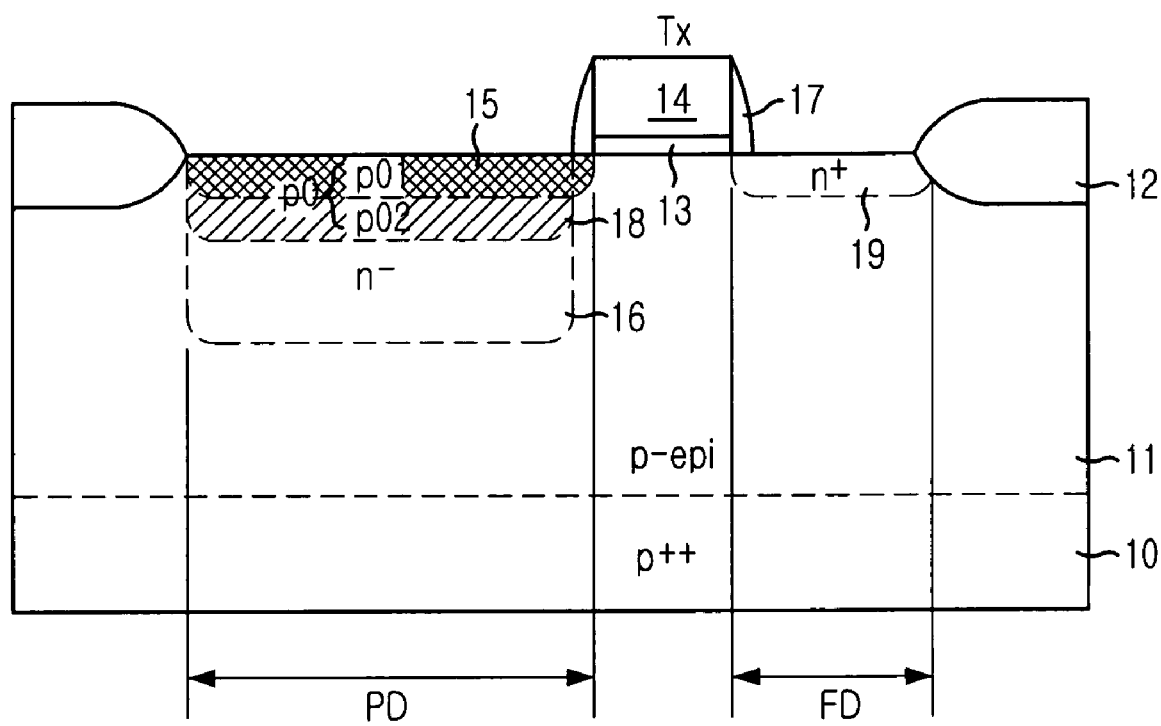
FIG. 2A is a cross-sectional view showing a part of a unit pixel of another conventional image sensor.
Figure 2B:
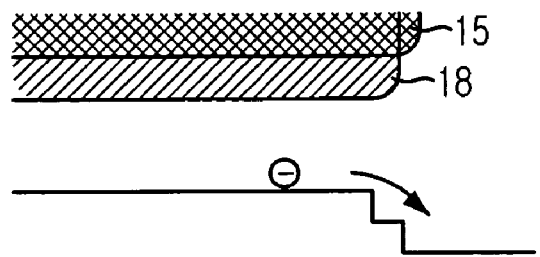
FIG. 2B is a diagram briefly showing a potential distribution of a p-type impurity region depicted in FIG. 2A.
Figure 3:
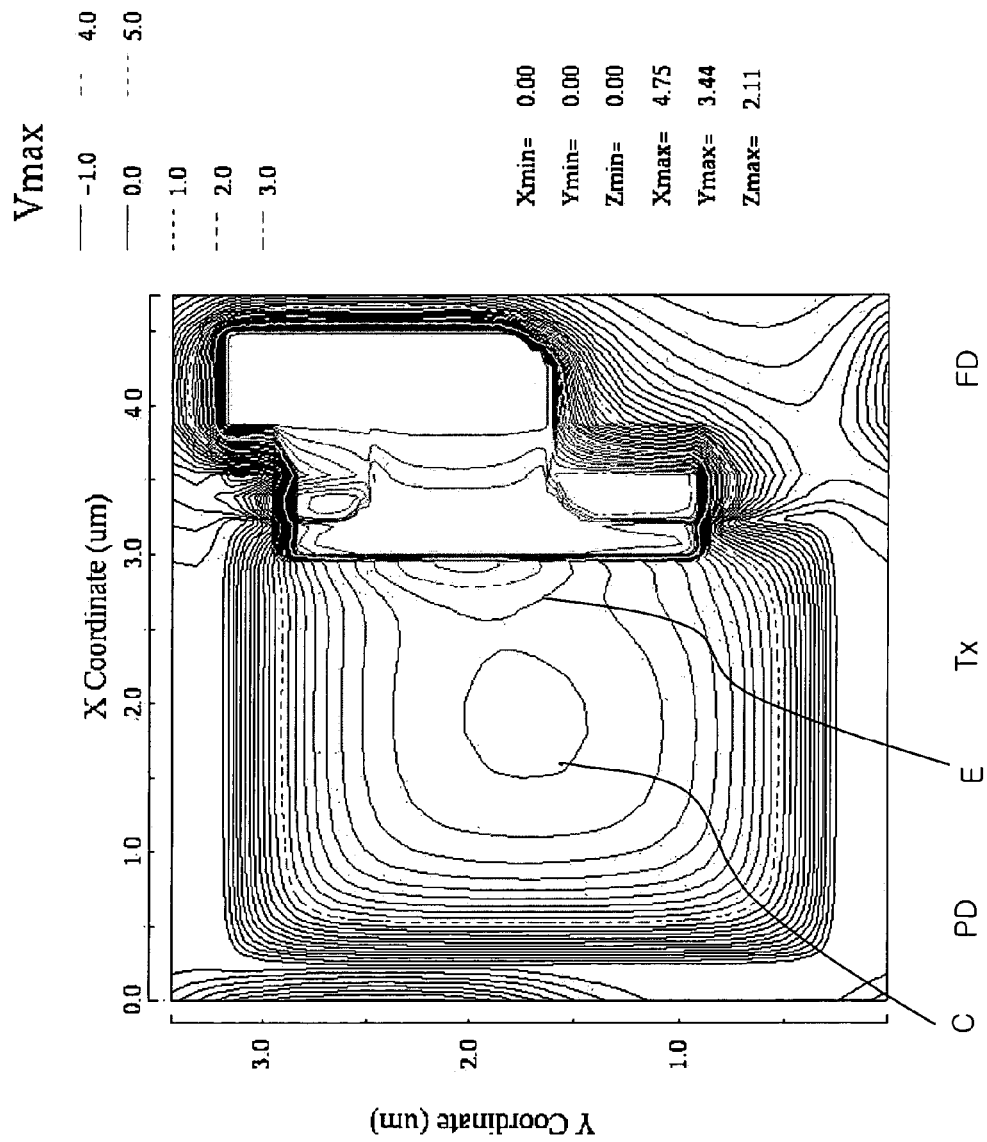
FIG. 3 is a graph showing a two-dimensional top view of a potential distribution and a concentration distribution of a conventional image sensor.

Compared with the potential distribution and the concentration distribution of the conventional image sensor shown in FIG. 3, a potential gradient is uniform at an edge region and a central region of a photodiode (PD) as indicated by reference denotations 'D' and 'F.'.

Figure 8:
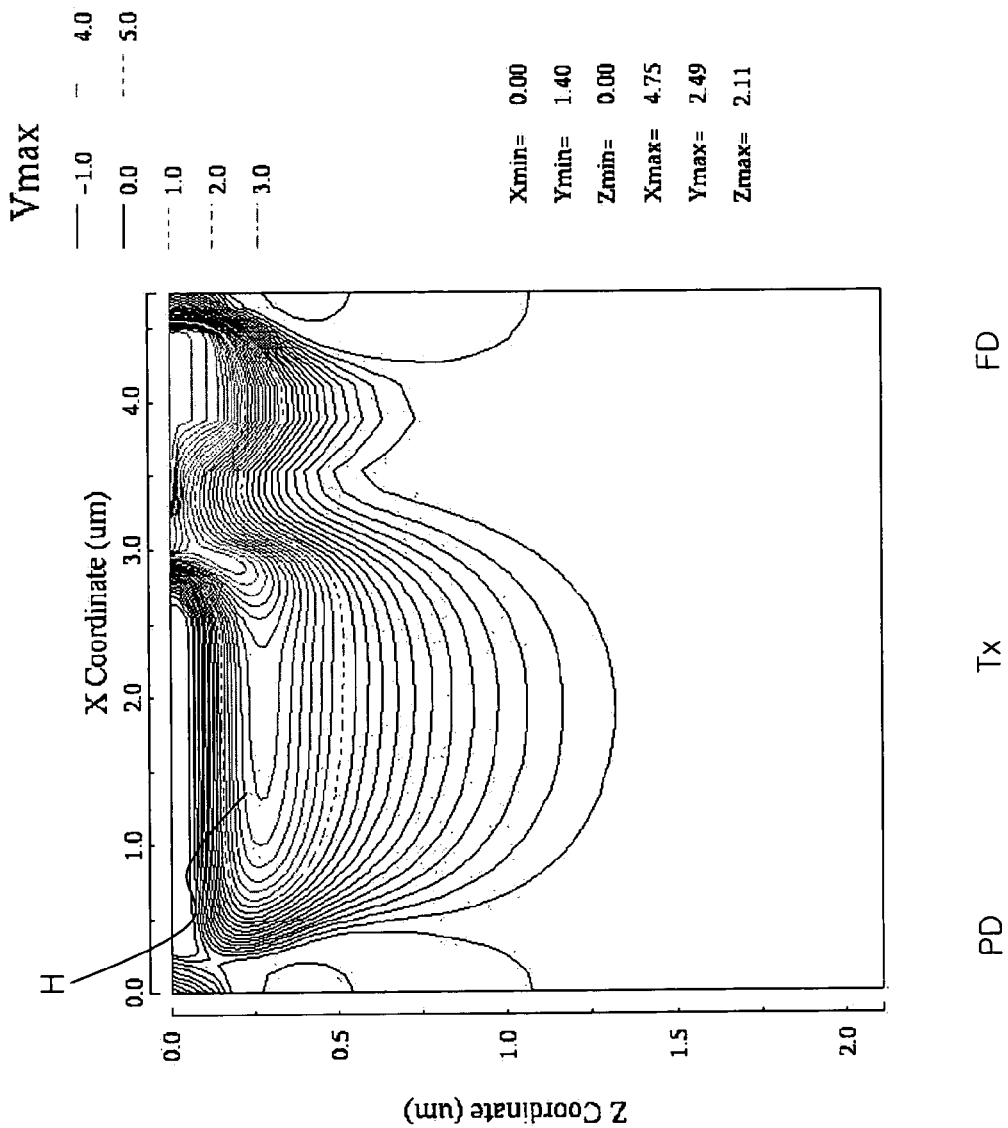
FIG. 8 is a graph showing a two-dimensional cross-sectional view of a potential distribution and a concentration distribution of an image sensor in accordance with another specific embodiment of the present invention.

FIG. 8 is a graph showing a two-dimensional cross-sectional view of a potential distribution and a concentration distribution of an image sensor in accordance with another specific embodiment of the present invention.

Figure 4:
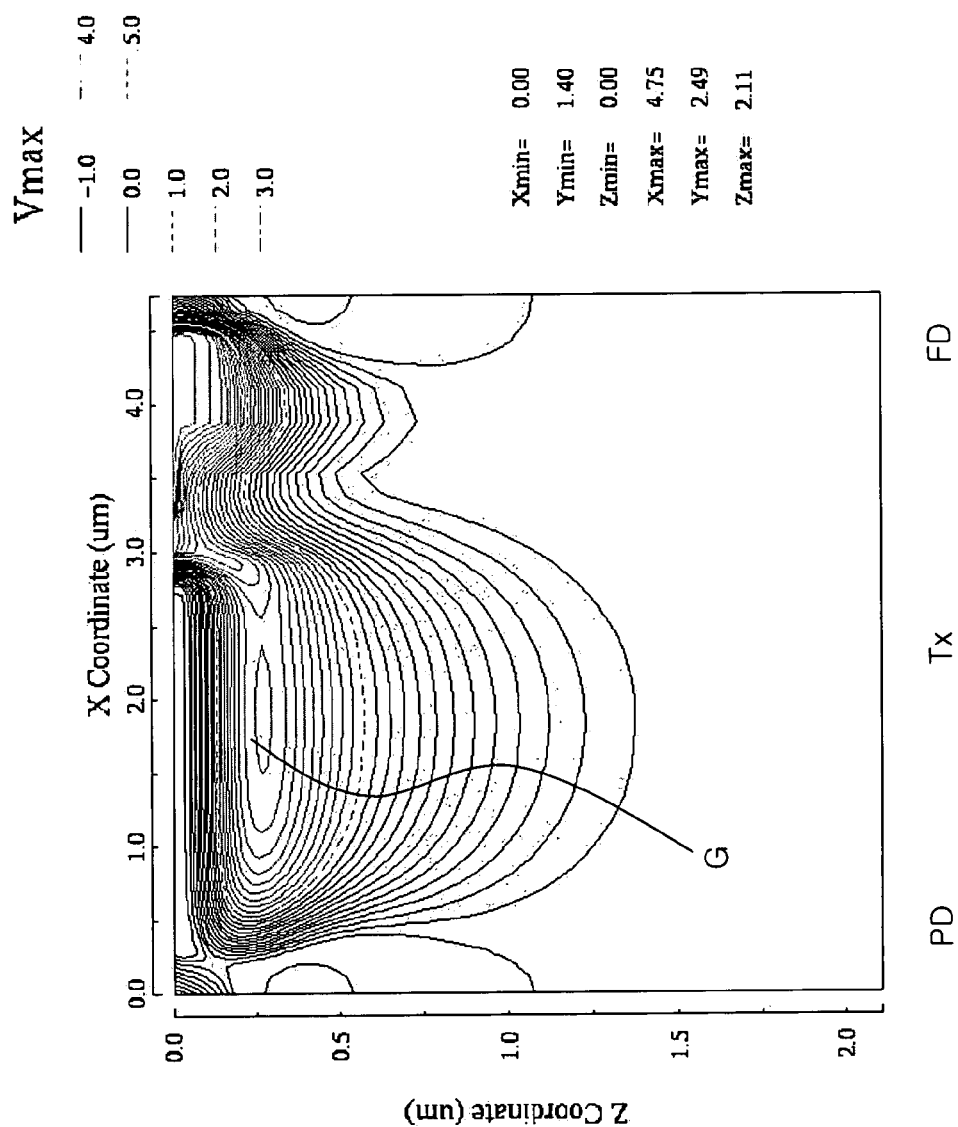
FIG. 4 is a graph showing a two-dimensional cross-sectional view of a potential distribution and a concentration distribution of a conventional image sensor.

Compared with the potential distribution shown in FIG. 4, the potential distribution between an edge region and a central region of a photodiode PD is continuous as indicated by a reference denotation 'H'.

In accordance with one embodiment of the present invention, an ion implantation process is performed three times (i.e., before forming spacers, after forming the spacers, and with using an ion implantation mask), and through three separately performed ion implantation processes, the whole p-type impurity region of a photodiode region becomes indented as the profiles of the spacers and the ion implantation mask are transcribed to certain portions of a semiconductor layer where the photodiode region is formed. As a result of the triple indentation structure, the charge transfer efficiency can be increased, resulting in an enhancement on functions of an image sensor.

The present application contains subject matter related to the Korean patent application No. KR 2004-59472, filed in the Korean Patent Office on Jul. 29, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating an image sensor, comprising:
   forming a gate structure on a semiconductor layer of a first conductive type;
   performing a first ion implantation process to form a first impurity region of a second conductive type aligned with one side of the gate structure and extending to a predetermined depth from a surface portion of the semiconductor layer;
   performing a first blanket ion implantation process to form a second impurity region of the first conductive type aligned with the one side of the gate structure and extending to a predetermined depth from the surface portion of the semiconductor layer;
   forming spacers on sidewalls of the gate structure;
   performing a second blanket ion implantation process to form a third impurity region of the first conductive type aligned with one of the spacers and extending to a predetermined depth from the surface portion of the semiconductor layer;
   forming an ion implantation mask exposing the surface portion of the semiconductor layer apart from the one side of the gate structure with a predetermined distance which is larger than a thickness of the one of the spacers; and
   performing a second ion implantation process using the ion implantation mask, thereby obtaining a fourth impurity region of the first conductive type extending to a predetermined depth from the surface portion of the semiconductor layer.

2. The method of claim 1, wherein the spacers include one of an oxide-based material and a nitride-based material.

3. The method of claim 1, further including, after the forming of the spacers, performing an ion implantation process to form a floating diffusion region of the second conductive type aligned with the other side of the gate structure and extending to a predetermined depth from another surface portion of the semiconductor layer.

4. The method of claim 1, wherein the forming of the third impurity region uses a higher level of energy than the forming of the second impurity region, and the forming of the fourth impurity region uses a higher level of energy than the forming of the third impurity region.

5. The method of claim 1, wherein the forming of the third impurity region and the forming of the fourth impurity region use a higher level of energy than the forming of the second impurity region.

* * * * *